United States Patent
Salfelner et al.

(10) Patent No.: US 9,680,442 B2
(45) Date of Patent: Jun. 13, 2017

(54) IMPEDANCE TUNING CIRCUIT

(71) Applicant: NXP B.V., Eindhoven (NL)

(72) Inventors: Anton Salfelner, Gratkorn (AT); Javier Mauricio Velandia Torres, Gratkorn (AT)

(73) Assignee: NXP B.V., Eindhoven (NL)

(*) Notice: Subject to any disclaimer, the term of this patent is extended or adjusted under 35 U.S.C. 154(b) by 331 days.

(21) Appl. No.: 14/645,177

(22) Filed: Mar. 11, 2015

(65) Prior Publication Data

US 2016/0268992 A1    Sep. 15, 2016

(51) Int. Cl.
| | | |
|---|---|---|
| *H03H 7/40* | (2006.01) | |
| *H01Q 1/50* | (2006.01) | |
| *H03K 5/24* | (2006.01) | |
| *H01Q 7/00* | (2006.01) | |

(52) U.S. Cl.
CPC ............. *H03H 7/40* (2013.01); *H01Q 1/50* (2013.01); *H01Q 7/00* (2013.01); *H03K 5/24* (2013.01); *H03H 2210/025* (2013.01)

(58) Field of Classification Search
CPC .. H03H 7/40; H01Q 1/50; H01Q 1/00; H03K 5/24

USPC .......................................................... 343/861
See application file for complete search history.

(56) References Cited

U.S. PATENT DOCUMENTS

| | | | | |
|---|---|---|---|---|
| 5,631,611 A | * | 5/1997 | Luu ........................ | H03H 7/40 333/17.3 |
| 5,949,291 A | * | 9/1999 | Newland .................. | H03L 1/00 327/156 |
| 9,425,762 B2 | * | 8/2016 | Kovac ...................... | H03H 7/12 |
| 9,520,854 B2 | * | 12/2016 | Kim ......................... | H03H 11/28 |
| 2013/0257558 A1 | * | 10/2013 | Kim ......................... | H03H 11/28 333/32 |
| 2015/0048896 A1 | * | 2/2015 | Kovac ..................... | H03H 7/12 333/17.1 |
| 2016/0268992 A1 | * | 9/2016 | Salfelner .................. | H03H 7/40 |

* cited by examiner

*Primary Examiner* — Lam T Mai
(74) *Attorney, Agent, or Firm* — Rajeev Madnawat

(57) ABSTRACT

A circuit for tuning an impedance matching network is disclosed. The circuit includes a current sensor, a control circuit coupled to the current sensor and a reference current source and a tunable capacitor coupled to the control circuit. The control circuit is configured to generate a control signal based on an output of the current sensor, wherein the control signal is configured to vary a capacitance of the tunable capacitor.

11 Claims, 5 Drawing Sheets

IMPEDANCE TUNING CIRCUIT

RELATED APPLICATIONS

This application is related to application Ser. No. 14/645,222, entitled "Impedance Measurement" filed concurrent to this application and being incorporated herein by reference. This application is also related to application Ser. No. 14/645,198, entitled "Antenna Tuning Circuit" filed concurrent to this application and being incorporated herein by reference.

BACKGROUND

Small Loop antennas in printed circuit boards (PCB) are commonly used in applications such wireless devices, for transmitting and receiving signals. The impedance of the antenna is inductive and sensitive to the environmental changes. The environmental changes may cause non optimal signal transmission operation. This mistuning causes power drop and large current variations in the power amplifier that provides the signal being transmitted via the antenna. The antennas are typically tuned at design or manufacturing stages and the devices containing these antennas are typically not configured to enable tuning of the antennas when the device is in use in the field.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In some embodiments, the tunable capacitor includes a plurality of switchable capacitor circuits and the tunable capacitor is coupled to the antenna. Each of the plurality of switchable capacitor circuits including a capacitor coupled to a ground via a switch. The switch is controllable by the control signal. In one embodiment, the tunable capacitor is coupled to an electrostatic discharge protection circuit.

In one or more embodiments, the control signal includes a plurality of bits, each of the plurality of bits coupled to a different switchable circuit in the plurality of switchable capacitor circuits. The control signal is an analog signal and the tunable capacitor is a voltage controlled variable capacitor.

In another embodiment, a system is disclosed. The system includes an antenna, an impedance matching circuit and an integrated circuit including a circuit for automatically tuning a variable capacitor based on an impedance mismatch between the impedance matching circuit and the antenna.

In one embodiment, the antenna is fabricated on a printed circuit board. In another embodiment, the integrated circuit is mounted on the same printed circuit board. In some embodiments, the integrated circuit is configured to detect a current corresponding to the impedance mismatch between the impedance matching circuit and the antenna and generate a binary signal corresponding to the detected current. The binary signal is used to vary capacitance of the variable capacitor. The variable capacitor includes a plurality of capacitors, each of the plurality of capacitors coupled to a ground through a switch. The switch is operable via a bit of the binary signal.

In yet another embodiment, a tunable capacitor having a minimum and a maximum capacitance is disclosed. The tunable capacitor includes a plurality of capacitors, each of the plurality of capacitors having a capacitance substantially less than the maximum capacitance. Each of the plurality of capacitors is coupled to a ground through a separate switching element. The tunable capacitor also includes an input port to receive a binary signal wherein a bit of the binary signal being coupled to the switch of the each of the plurality of capacitors.

In one embodiment, the tunable capacitor also includes an electro static protection circuit. The tunable capacitor may also include a port to receive a bias voltage. The switch is configured to be turn on or off based on the value of the bit.

In one embodiment, the tunable capacitor further includes a minimum value capacitor of value equal to the minimum capacitance, wherein the minimum value capacitor is not coupled to the ground via a switch.

In yet another example, a circuit is disclosed. The circuit includes a voltage regulator, a current sensor coupled to the voltage regulator, a voltage sensor, a power amplifier coupled to the voltage sensor and current sensor and a controller coupled to the current sensor and the voltage sensor, wherein the controller is configured to produce a control signal based on inputs from the current sensor and the voltage sensor. In one example, the controller is coupled to current and voltage references and includes a comparator circuit that compares input from the current sensor and input from the voltage sensor to the current and voltage references respectively, to produce the control signal. In another example, the controller is programmable and executed by a processor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
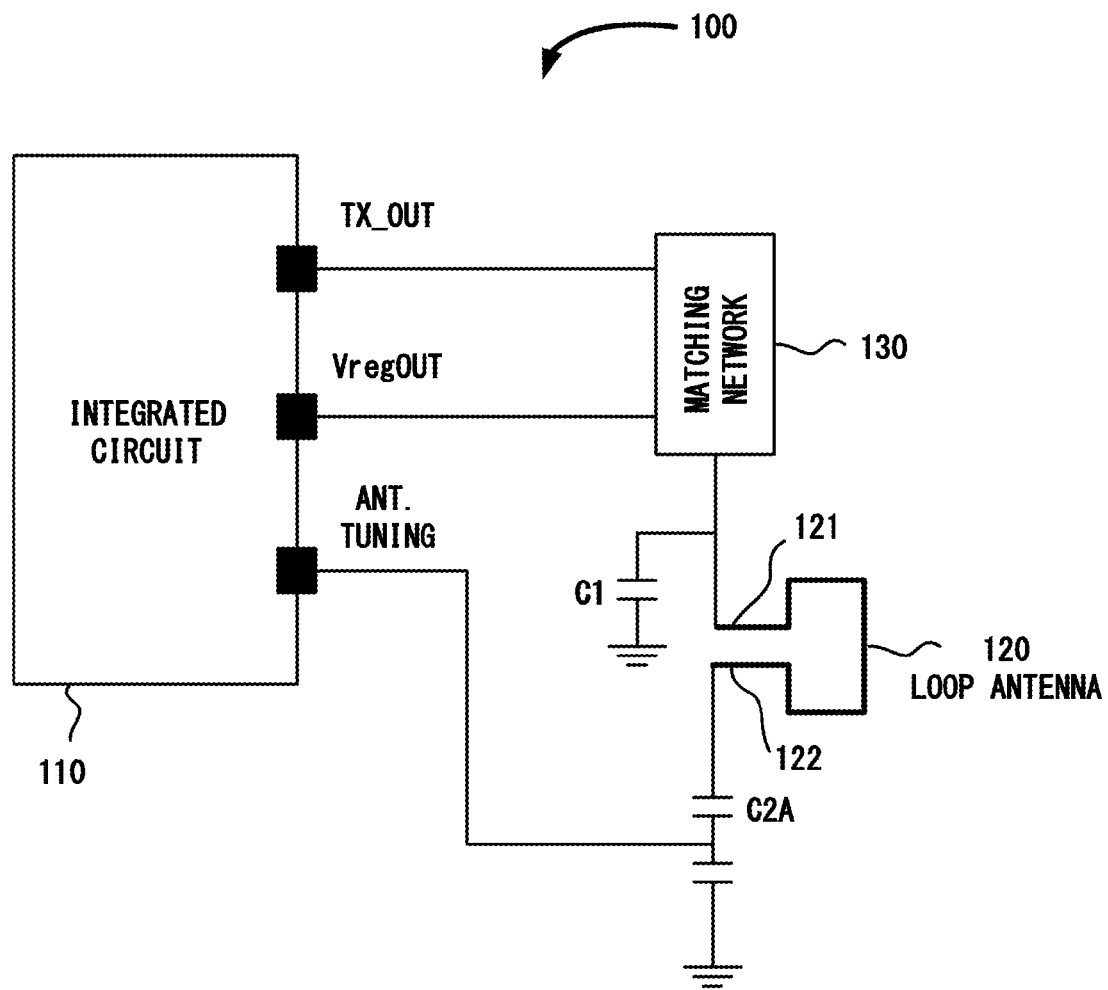
FIG. 1 is an a portion of a wireless communication system designed to provide automatic antenna tuning.

FIG. 1 illustrates a portion of a wireless system including automatic antenna tuning 100. The wireless system 100 includes an integrated circuit (IC) 110 that includes a circuit for automatically tuning an antenna 120 that is coupled to the IC 110. Typically but not necessarily, the antenna 120 is printed or embossed on a printed circuit board (PCB) and used in mobile devices, remote controls, keyless locking systems or similar applications in which a wireless communication is used. The wireless system 100 includes a matching network 130 that is typically a RLC or LC circuit or other combinations thereof, where R is resistance, L is inductance and C is capacitance.

Typically the matching network 130 is used to provide impedance matching. Typical loop antenna matching consists on capacitive termination for the antenna 120 in both terminals so that a choice of the capacitors coupled to the antenna 120 brings the inductance of the antenna 120 to resonate to provide an equivalent parallel impedance typically in the order of 50 ohms seen at the antenna input 121. The other terminal of the antenna 120 is the antenna end 122. The IC 110 includes various pins such as TX_OUT, VregOUT and ANT. TUNING (Antenna Tuning Pin). The IC 110 may include other pins, such as a power pin, a ground pin, etc. Other pins are not being shown so as not to obfuscate the disclosure.

Mistuning of the antenna 120 may occur due to environmental factors. The devices that include the antenna 120 are typically designed such that it is not possible for the users of such devices to change the capacitance at the antenna end 122 to correct any mistuning of the antenna 120. Besides, even if it can be made possible, it is unlikely that a typical user will be able to adjust the capacitance at the antenna end 122 for optimal tuning.

Mistuning may typically be due to a change in inductance due to environment. The variation of the inductance can be compensated by adjusting the capacitors at the antenna 120 so that the equivalent seen at the antenna input still resonates like before without the mistuning effect.

When a constant voltage but of varying frequency is applied to a circuit consisting of an inductor, capacitor and resistor the reactance of both the Capacitor/Resistor and Inductor/Resistor circuits is to change both the amplitude and the phase of the output signal as compared to the input signal due to the reactance of the components used. At high frequencies the reactance of a capacitor is very low acting as a short circuit while the reactance of the inductor is high acting as an open circuit. At low frequencies the reverse is true, the reactance of the capacitor acts as an open circuit and the reactance of the inductor acts as a short circuit. Between these two extremes the combination of the inductor and capacitor produces a "Tuned" or "Resonant" circuit that has a Resonant Frequency, in which the capacitive and inductive reactance's are equal and cancel out each other, leaving only the resistance of the circuit to oppose the flow of current. This means that there is no phase shift as the current is in phase with the voltage.

Typically the values of capacitors C1 and C2A are calculated and fixed during the design phase of a device that incorporate the antenna 120. ANT. TUNING pin is coupled to the antenna end 122 and the logic built into the IC 110 is configured to vary the capacitance at the antenna end 122 to provide antenna tuning Among others, one advantage of the IC 110 is that in wireless applications, application designers can use the IC 110 to provide "plug and play" automatic tuning of the antenna 120.

Figure 2:
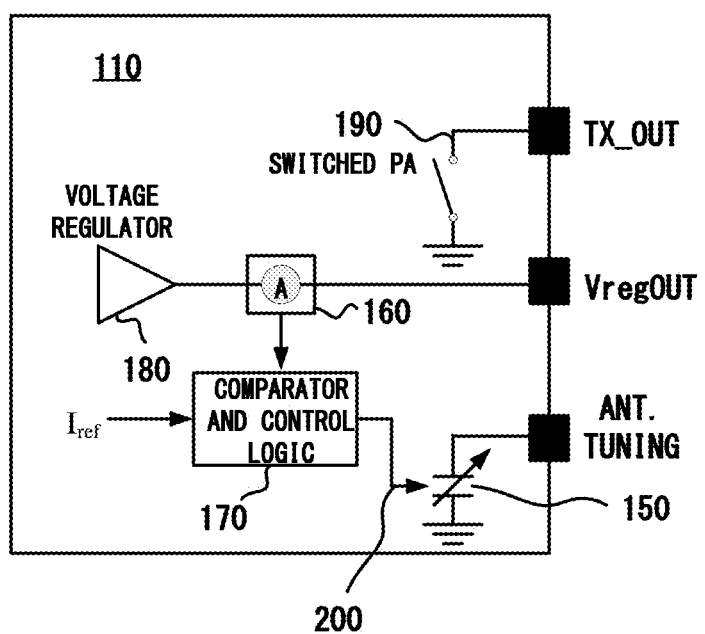
FIG. 2 illustrates schematic of an integrated circuit depicted in FIG. 1 in accordance to one of more embodiments of the present disclosure.

FIG. 2 illustrates the schematic of the IC 110. It should be noted that only some components of the IC 110 are being depicted in FIG. 2 so as not to obfuscate the disclosure. The IC 110 includes a switched power amplifier (PA) 190 coupled to TX_OUT pin. The switched PA 190 provides a high frequency signal to TX_OUT pin. A voltage regulator 180 provides a low frequency envelop signal and the voltage regulator 180 is coupled to VregOUT pin through a current sensor 160. Additionally, the switched PA 190 may also be coupled to the voltage regulator 180. The current sensor 160 is coupled to the voltage regulator 180 and a comparator and control logic 170. The comparator and control logic 170 may be implemented in software or hardware. Typically a processor or a microcontroller (not shown) can provide the processing logic for comparing the current values received from the current sensor 160 and $I_{ref}$ input.

In one embodiment, the comparator and control logic 170 is implemented using a comparator that outputs a voltage corresponding to the difference between $I_{ref}$ and the current input from the current sensor 160. The output of the comparator may be inputted to an analog to digital converter to obtain a binary output corresponding to the analog output from the comparator.

The output 200 of the comparator and control logic 170 is a coded word (a group of bits). In some embodiments the coded word may include a plurality of sub groups of bits. For example, one group may include bits for a first operation and the other group may include bits for a second operation. By the way of a non-limiting example, if 8 bit coded word is used, 4 bits may be used for coarse tuning of the antenna 102 and the remaining 4 bits may be used for fine tuning of the antenna 120. Alternatively, all bits of the coded word may be used for one type of operation such as tuning the antenna 120.

The IC 110 includes a tunable capacitor 150. The tunable capacitor 150 is a composite component that provides variable capacitance that is controllable through the output 200 of the comparator and control logic 170. The comparator and control logic 170 is programmed or configured to generate the coded word based on the input from the current sensor 160 and $I_{ref}$. The output 200 may be a multibit bus for carrying a binary code word. For example, in one embodiment, the output 200 may be a bus suitable for carrying at least 8 bit signal if the comparator and control logic 170 provides 8 bit control signal.

Figure 3:
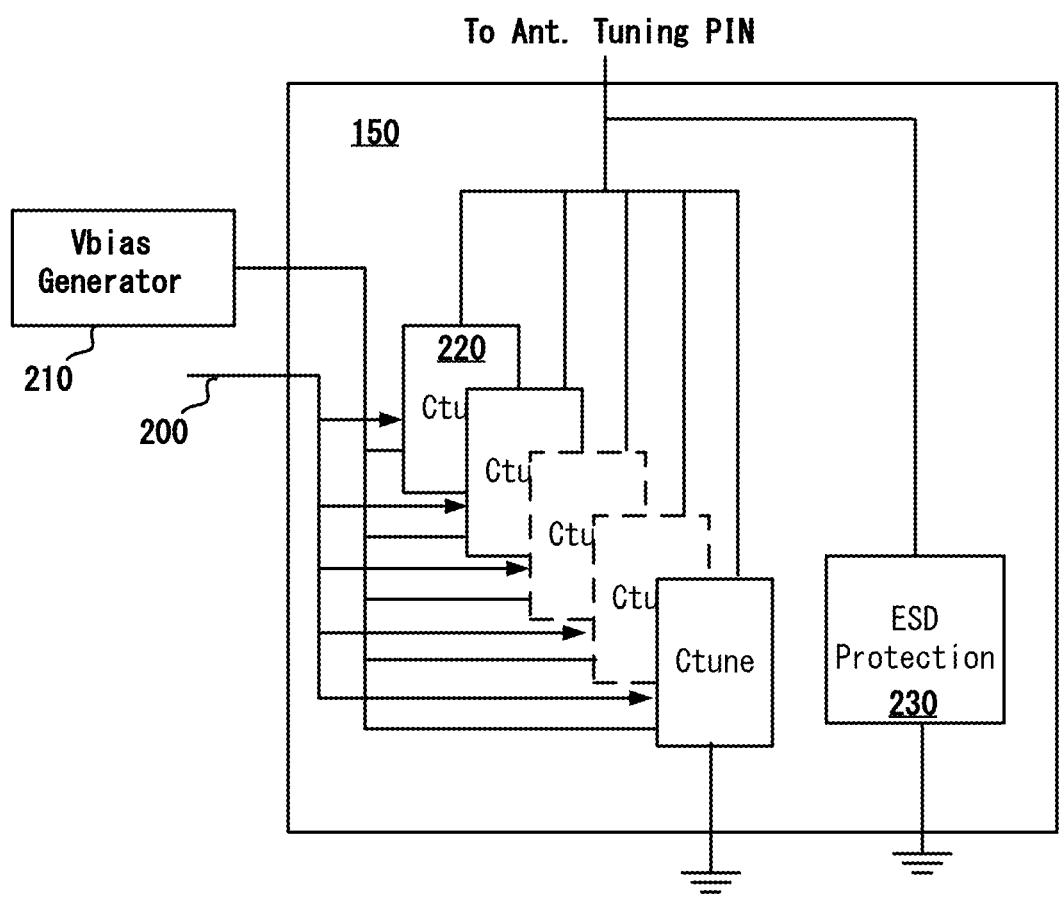
FIG. 3 illustrates a schematic of a tunable capacitor in accordance to one of more embodiments of the present disclosure.

FIG. 3 is a schematic of the tunable capacitor 150. The tunable capacitor 150 includes a plurality of Ctunes 220. A Ctune is a component that includes a switchable capacitance. The number of Ctunes in the tunable capacitor 150 may be related to the width of the output 200. For example, if the output 200 is 8-bit wide, there may be 256 Ctunes in the tunable capacitor 150. The coded word in the output 200 may turn on or off each of the Ctunes if the number of Ctunes corresponds to the width of the coded word.

In some embodiments, the number of Ctunes may be less than that can be controllable by the output 200 and if so, some codes in the output 200 may be non-operational. Similarly, if the tunable capacitor 150 includes more Ctunes than the number that can be digitally controlled by the coded word in the output 200, the excess Ctunes may be used to provide a minimum capacitance.

The tunable capacitor 150 may also include an electrostatic discharge (ESD) protection circuit 230. ESD is a the sudden flow of electricity between two electrically charged objects due to various factors such as electrical short, switching or dielectric breakdown. ESD can create spectacular electric sparks and cause permanent damage to a device. ESD protection mechanisms are well known to a person skilled in the art, hence a detailed description is being omitted. In one embodiment, the ESD protection 230 is designed for fast response time, low clamping and operating voltages and for capacity to handle high peak ESD currents. The ESD protection 230 is also designed to remain undamaged by repetitive ESD strikes and for a low reverse leakage current. In one embodiment, the ESD protection 230 may be implemented using silicon-controlled rectifier and diodes.

As described above, the output 200 includes a binary word. Each of the binary bits in the binary word is used to turn on or off a particular capacitor/switch pair in the Ctune 220 in the tunable capacitor 150. Hence, a particular combination of zeros and ones in the binary word in the output 200 can switch off (or on) some capacitors through turning of respective switches. Based on the logic built into the comparator and control logic 170, the binary word includes appropriate number of zeros and ones to provide a desired capacitance in the tunable capacitor 150.

Further, as the capacitance of the tunable capacitor 150 changes, the impedance of the antenna 120 also changes. This change in the antenna impedance changes load and the current drawn from the voltage regulator 180 also changes. Since the current values are continuously provided to the comparator and control logic 170, in some embodiments, the process of tuning of the tunable capacitor 150 runs in a continuous loop. Therefore, the antenna 120 is automatically tuned automatically as soon as the environmental factors or external interferences cause a change in the impedance of the antenna 120.

A $V_{bias}$ generator 210 is used to provide a DC level that is high enough to prevent signal clipping effect. Typically, $V_{bias}$ may be simply coupled to battery or a DC power source. If a $V_{bias}$ voltage higher than the battery voltage is required to prevent signal clipping, the $V_{bias}$ generator 210 may include a circuit (e.g., a DC-DC converter) to boost the DC power source voltage level.

The tunable capacitor 150 includes a port for receiving a bias voltage input and a port for receiving a binary control signal. A bit of the binary control signal is coupled to a switch of a Ctune 220. The tunable capacitor 150 may also include a minimum value capacitor having a value that corresponds to the minimum tunable capacitance of the tunable capacitor 150. This minimum value capacitor is not configured to be switched on or off. In other words, this additional capacitor differs from the capacitors of a Ctune 220 in that the capacitor in the Ctune 220 can be turned on or off while the same is not true for this minimum value capacitor. The tunable capacitor 150 has a maximum capacitance. The maximum capacitance can be derived when all capacitors in the Ctune 220 are in the circuit. That is, the switches associated with each of the capacitors are on, thereby coupling the respective capacitors to ground.

It should be noted that the output 200 may be an analog signal in some embodiment and the tunable capacitor 150 may include components that can change capacitance based on an analog signal. For example, the tunable capacitor 150 may include one or more varicap diodes that change capacitance based on the applied voltage.

Figure 4:
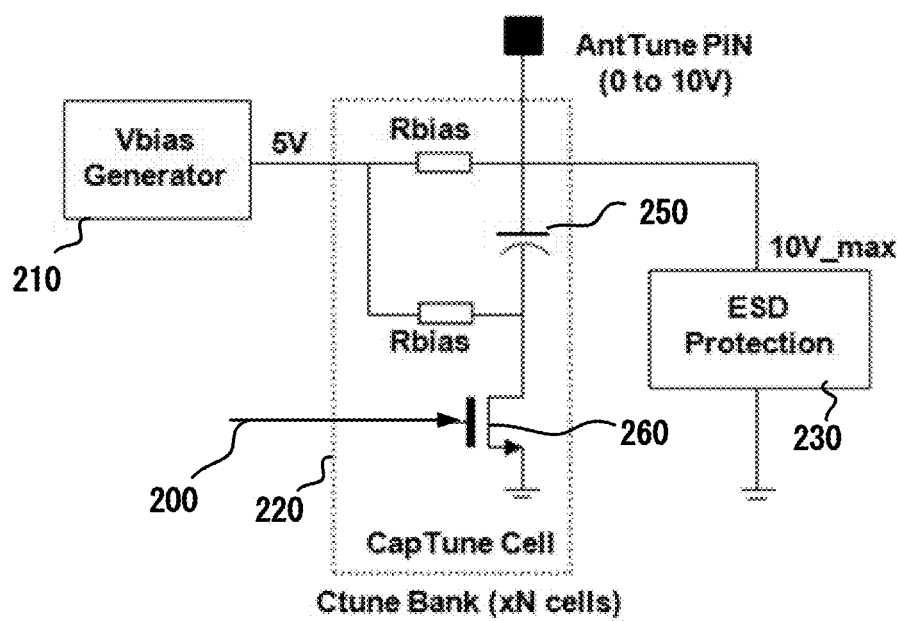
FIG. 4 illustrates a unit of the tunable capacitor shown in FIG. 3 in accordance with an embodiment of the present disclosure.

FIG. 4 depicts an example of a Ctune 220 circuit. It should be noted that the voltage values indicated in FIG. 4 are provided merely as examples. A Ctune 220 includes a capacitor 250 and a switch 260. The switch 260 is controllable by the output 200 of the comparator and control logic 170. When the switch 260 is closed, the capacitor 250 is connected to the ground and as a result, the capacitor 250 adds to the capacitance to the tunable capacitor 150. If the switch 260 is open, the capacitor 250 is dormant, hence, its values is not added to the capacitance of the tunable capacitor 150. The comparator and control logic 170 is calibrated and configured to produce a control signal (e.g., the output 200) to produce a desired capacitance via the tunable capacitor 150.

In other embodiments, the tunable capacitor 150 can also be implemented such that the tunable capacitor 150 is tunable using analog means as opposed to digital words as described above. For example, the tunable capacitor 150 may be a voltage controlled capacitor whose capacitance varies based on the value of an analog input. In this example, the comparator and control logic 170 will produce a variable voltage based on the output of the current sensor 160 and $I_{ref}$. In one embodiment, the comparator and control logic 170 is programmed or designed to keep the current as sensed by the current sensor 160 within a preset band based on the value of $I_{ref}$.

Referring back to FIG. 1, in some embodiments, the value of the capacitor C2A is designed such that the value of the capacitor 250 is not a large value because a large value of the capacitor 250 would require a large silicon area in the IC 110. On the other hand, to have a wide tuning range, the value of the capacitor 250 should not be too low. In one embodiment, an optimal value of the capacitor C2A can be calculated based on experimental capacitance values needed for tuning the antenna 120 under varying environmental change conditions.

An impedance of 50 ohms is a typical target used for the PA load impedance in the PA matching network. So the complete system is well matched when the antenna input is connected to the pa matching network output. It should be noted that even though the disclosure uses an antenna tuning system to explain various circuits, a person of ordinary skills will realize that the circuits described herein, especially the tunable capacitor circuit, may also be used in other applications that require am automatically variable capacitance.

Figure 5:
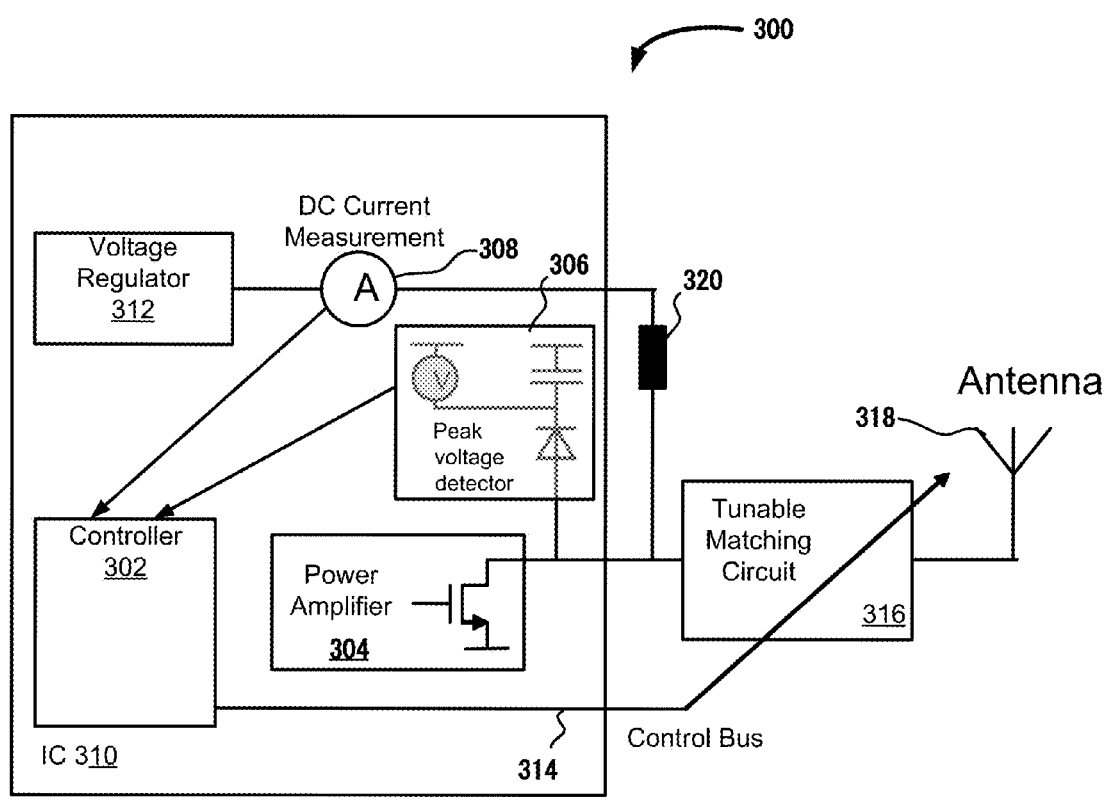
FIG. 5 illustrates an impedance control system according to one or more embodiments.

FIG. 5 illustrates an impedance control system 300 in another example. The impedance control system 300 includes an integrated circuit (IC) 310. In addition to generating a control signal to alter the capacitance of a variable capacitor, as described above, in this example, the controller 302 may be implemented to compare both a current input and a voltage input with respective reference values and generate a voltage signal based on the both comparisons. In another example, the controller 302 may be implemented in software that can be executed by a processor (not shown) and can produce a digital output corresponding to the input voltage and the input current. The output voltage signal may be converted into a digital signal using a digital to analog converter. In one example, the tunable matching circuit 316 may be implemented using components (such as varicap diodes) that can be operated through an analog signal. In such examples, if the tunable matching circuit 316 is controllable by an analog voltage signal, the output of the controller 302 does not need to be converted into a digital signal.

The control output is transmitted to the tunable matching circuit 316 on a control bus 314 that is adapted to be coupled to the tunable matching circuit 316. The tunable matching circuit 316 is coupled to an antenna 318. It should be noted that even though an example of a receiver is used herein, the systems and methods described herein may also be used for tuning a matching network of a transmitter system without deviating from the principles described herein.

In one example, a voltage regulator 312 applies a voltage to a power amplifier 304. An impedance component 320 may be used in the coupling of the voltage regulator 312 and the power amplifier 304. Said coupling path includes a current measuring device 308. In addition, a voltage measuring circuit or device 306 is used to measure voltage at the power amplifier terminal that couples the power amplifier 304 to the tunable matching circuit 316. The voltage and current measurement are provided to the controller 302. In this example, higher values of current and voltage would indicate a better tuning of the tunable matching network 316.

It should be noted that impedance matching is the practice of designing the input impedance of an electrical load or the output impedance of its corresponding signal source to maximize the power transfer or minimize signal reflection from the load. So as not to obfuscate the disclosure, many components that are known to a person skilled in the art are not being shown and/or discussed, at least in details.

Tuning the tunable matching circuit 316 based both on the current and voltage inputs provides advantages of better tuning of the tunable matching circuit 316 for a complex load scenarios. For arbitrary impedances, tuning based only on current consumption alone may not result in optimum tuning. In one example, in addition to variable capacitors, the tunable matching circuit 316 may also include variable components of types other than variable capacitors. For example, the tunable matching circuit 316 may include variable resistor and/or variable inductors, to effectively mimic a complex load. A tuning based on the current input is performed by altering the value of one type of variable component such as the variable capacitor in the tunable matching circuit 316. It should be noted that in some examples, at least some variable components may be fabricated inside the IC 310.

After performing the tuning operation by altering one type of variable component, the tuning is perform by altering another type of variable component to achieve an optimal overall tuning for optimal power output. It should be noted that relationship between the power output to the impedance of the components of the matching circuit 316 is not linear. Generally speaking, altering the value of a particular type of variable component that contribute to the overall impedance of the tunable matching circuit 316 varies the output power on one axis. More practically, the variations follow roughly a circular path in on one axis. Altering the value of another type of impedance component (such as a resistor or inductor) varies the output power in another axis. Therefore, optimal power output can be achieved by tuning for both current and voltage.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit, comprising:
   a current sensor;
   a control circuit coupled to the current sensor and a reference current source; and
   a tunable capacitor coupled to the control circuit, wherein the control circuit is configured to generate a control signal based on an output of the current sensor, wherein the control signal is configured to vary a capacitance of the tunable capacitor.

2. The circuit of claim 1, wherein the tunable capacitor is coupled to an antenna tuning pin.

3. The circuit of claim 1, wherein the tunable capacitor includes a plurality of switchable capacitor circuits.

4. The circuit of claim 2, wherein each of the plurality of switchable capacitor circuits including a capacitor coupled to ground via a switch.

5. The circuit of claim 4, wherein the switch is controllable by the control signal.

6. The circuit of claim 1, wherein the tunable capacitor is coupled to an electrostatic discharge protection circuit.

7. The circuit of claim 3, wherein the control signal includes a plurality of bits, each of the plurality of bits coupled to a different switchable circuit in the plurality of switchable capacitor circuits.

8. The circuit of claim 6, wherein the control signal is an analog signal and the tunable capacitor is a voltage controlled variable capacitor.

9. The circuit of claim 1, wherein the tunable capacitor has a minimum and a maximum capacitance and the tunable capacitor includes:
   a plurality of capacitors, each of the plurality of capacitors having a capacitance substantially less than the maximum capacitance, wherein each of the plurality of capacitors is coupled to a ground through a separate switching element; and
   an input port to receive a binary signal, a bit of the binary signal being coupled to the switch of the each of the plurality of capacitors.

10. The circuit of claim 9, wherein the tunable capacitor further including an electro static protection circuit.

11. The circuit of claim 9, wherein the tunable capacitor further including a port to receive a bias voltage.

* * * * *